US008111181B2

(12) United States Patent
Balachandran et al.

(10) Patent No.: US 8,111,181 B2
(45) Date of Patent: Feb. 7, 2012

(54) SINGLE-ENDED POLAR TRANSMITTING CIRCUIT WITH CURRENT SALVAGING AND SUBSTANTIALLY CONSTANT BANDWIDTH

(75) Inventors: Ganesh K. Balachandran, Irving, TX (US); Baher S. Haroun, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 298 days.

(21) Appl. No.: 12/577,075

(22) Filed: Oct. 9, 2009

(65) Prior Publication Data

US 2011/0084864 A1    Apr. 14, 2011

(51) Int. Cl.
  *H03M 1/66*   (2006.01)
(52) U.S. Cl. ........ 341/144; 348/264; 348/554; 375/229; 333/215; 455/139; 455/307
(58) Field of Classification Search .......... 341/130–172; 348/264, 554; 375/229; 333/215; 455/139, 455/307
  See application file for complete search history.

(56) References Cited

U.S. PATENT DOCUMENTS

| 5,949,820 | A  | * | 9/1999  | Shih et al. ..................... 375/229 |
| 6,040,692 | A  | * | 3/2000  | Manlove et al. .............. 324/173 |
| 6,154,017 | A  | * | 11/2000 | Contreras ..................... 323/315 |
| 6,674,279 | B2 | * | 1/2004  | Manlove et al. .............. 324/166 |
| 7,714,665 | B2 | * | 5/2010  | Waheed et al. ................ 331/16 |
| 2003/0210035 | A1 | * | 11/2003 | Manlove et al. .............. 324/166 |
| 2004/0013179 | A1 | * | 1/2004  | Cheng et al. .................. 375/219 |

* cited by examiner

*Primary Examiner* — Lam T Mai
(74) *Attorney, Agent, or Firm* — John R. Pessetto; W. James Brady; Frederick J. Telecky, Jr.

(57) ABSTRACT

An embodiment of the invention provides a single-ended polar transmitting circuit. The single-ended polar transmitting circuit comprises a DAC, a differential-to-single-ended converter, a GmC filter and a load. The GmC filter comprises two gain stages, two filters, two switching devices, a translinear loop and a current mirror. When a second clock signal is high, a first current is conducted through the load, a second switching device and a second gain stage. When a first clock signal is high, a second current is conducted through a first switching device and the second gain stage. The first gain stage has a transconductance Gm1 and the second gain stage has a transconductance Gm2. The bandwidth of the GmC filter is approximately equal to the square root of the quantity (Gm1*Gm2)/(C1*C2). The bandwidth of the GmC filter is substantially a constant value.

17 Claims, 5 Drawing Sheets

US 8,111,181 B2

SINGLE-ENDED POLAR TRANSMITTING CIRCUIT WITH CURRENT SALVAGING AND SUBSTANTIALLY CONSTANT BANDWIDTH

BACKGROUND

Digital-to-Analog converters (DACs) are found in many electronic devices. For example, DACs are used in PDAs (Personal Digital Assistant), cellular phones, computers, video players and CD players. DACs convert a digital signal into an analog signal. Analog signals include music and voice.

Cell phones, for example, may transmit analog signals. In order to transmit an analog signal, a mixer is used to convert a signal from one frequency to a higher frequency. For example, an analog signal, such as music or voice (baseband analog signal), may be up-converted to a higher frequency for ease of transmission. A mixer is often used to up-convert analog signals for transmission.

Various types of mixers may be used such as active and passive mixers. Active mixers usually have an associated gain where as passive mixers may have a gain of one at best. Active mixers include single-ended and differential implementations. Differential mixer implementations are often used to cancel undesired noise. A differential mixer may be implemented in a single-balanced configuration or a double-balanced configuration for example.

Noise may be added to a signal being transmitted. Noise may be any electrical contribution added to a signal that was not part of the original source that created the signal. Noise may be added to a signal during digital-to-analog conversion or during the up-conversion of a signal during mixing. During the process of converting a digital signal to an analog signal, the original signal may be distorted. There are many types of distortion such as harmonic distortion and intermodulation distortion.

Low-pass filters are often used to remove high frequency noise that may be created by a DAC. The high frequency noise created by a DAC is usually removed by a low-pass filter before an analog signal from the DAC is up-converted by a mixer for transmission. For example, GmC filters or op-amp RC biquadratic filters are often used to remove high frequency noise from a signal before up-converting the signal with a mixer.

Because DACs and mixers are often used on electronics that are portable, the amount of area used to implement them is an important design consideration. The area used to implement a circuit is also proportional to the cost of implementation, especially for integrated circuits where a smaller silicon area corresponds to a cheaper integrated circuit. Portable electronics that use DACs and mixers also have low power requirements. As a result, in many applications DACs and mixers should be small physically and use as little power as possible.

DETAILED DESCRIPTION

The drawings and description, in general, disclose a single-ended polar transmitting circuit with efficient current use. The single-ended polar transmitting circuit makes use of the current often used to drive a second load of a double-balanced mixer. Instead of driving the second load of a double-balanced mixer, the single-ended polar transmitting circuit uses at least a portion of this current as feedback to maintain linearity of the output. A translinear loop is also included in the single-ended polar transmitting circuit. The translinear loop, among other advantages, helps to reduce noise and maintain a substantially constant bandwidth filter as will be explained later.

Power and area savings are also achieved when current often used to drive the second load of a double-balanced mixer is used as current feedback (current "salvaging") to complete the main loop. Baluns are not necessary when using a single-ended polar transmitting circuit.

Figure 1:
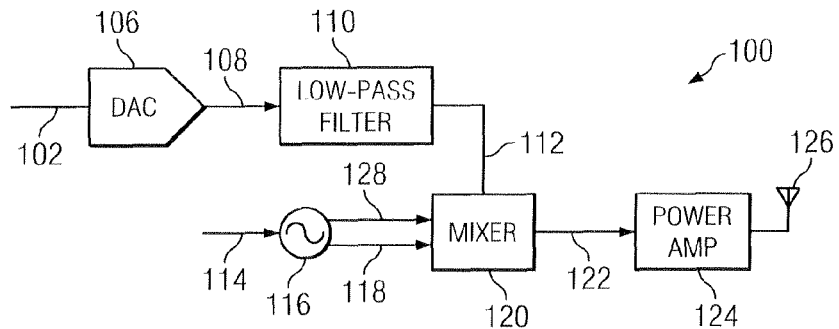
FIG. 1 is a block diagram of an analog polar transmitting circuit.

FIG. 1 is a block diagram of an analog polar transmitting circuit 100. FIG. 1 is included to explain the general principles of the operation of an analog polar transmitting circuit. In this block diagram, the magnitude of a digital polar signal is input into input 102 of DAC 106. The phase of the digital polar signal is input into the input 114 of a voltage controlled oscillator (VCO) 116. The output 108 of DAC 106 is feed into a low-pass filter 110 to remove high frequency noise created by the DAC 106. GmC filters or op-amp RC biquadratic filters are often used to remove high frequency noise.

The phase-modulated VCO 116 produces a clock signal 118 and a clock signal 128. Clock 118 is approximately 180 degrees out of phase with clock signal 128. Clock signals 118 and 128 are fed into mixer 120. An analog signal 112 is also fed into mixer 120 wherein the analog signal 112 is then up-converted to a higher frequency signal 122. The high frequency signal 122 is then fed into a power amplifier 124. The power amplifier 124 amplifies the high frequency signal 122 to give it enough power to drive antenna 126.

Figure 2:
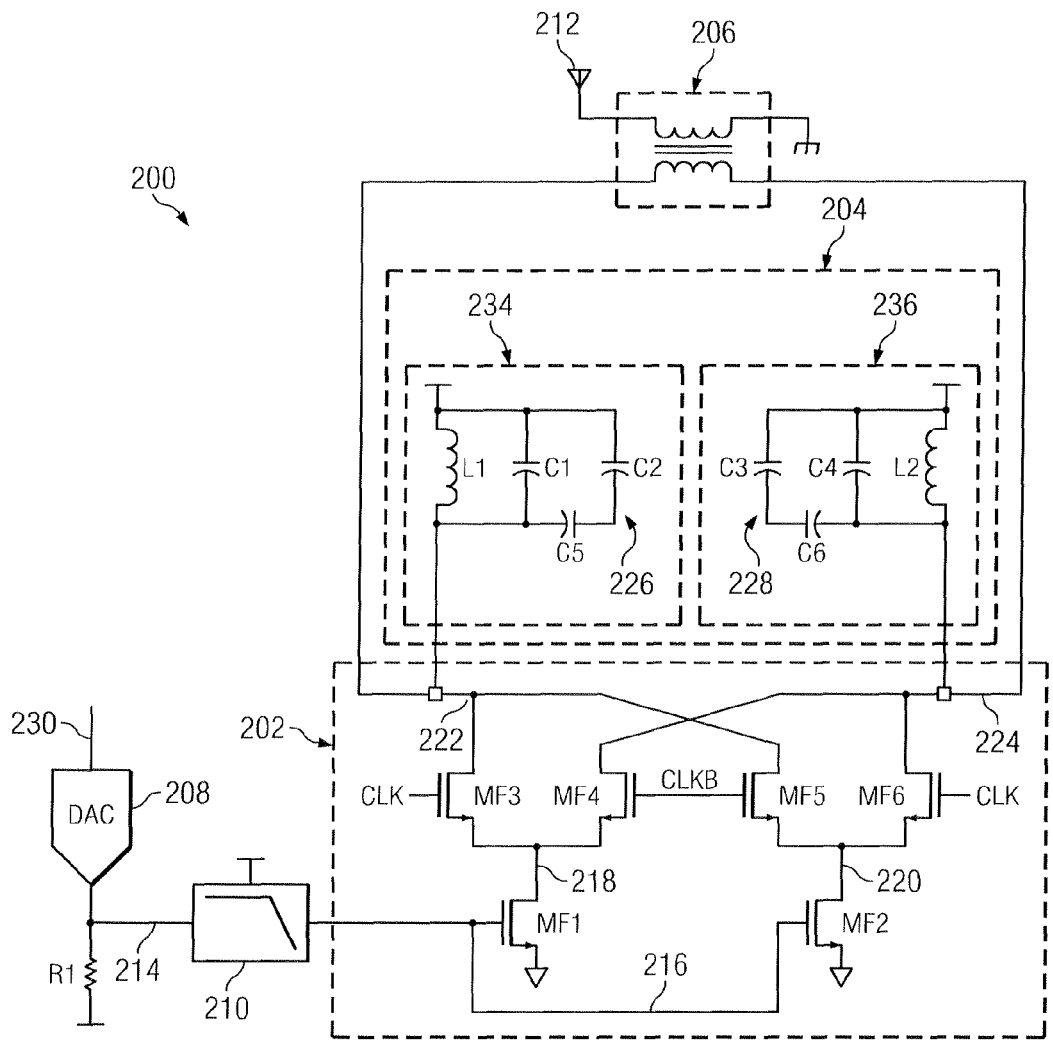
FIG. 2 is a schematic of an analog polar transmitting circuit including a DAC, an op-amp RC biquadratic filter, a double-balanced mixer (Gilbert cell), a load, a balun and an antenna.

FIG. 2 is a schematic of an analog polar transmitting circuit 200 including a DAC 208, a voltage mode op-amp RC biquadratic filter 210, a double-balanced mixer (Gilbert cell) 202, a load 204, a balun 206 and an antenna 212. FIG. 2 is included to explain in more detail the general is principles of the operation of an analog polar transmitting circuit.

The magnitude of a digital polar signal is input to a DAC 208 through input 230. The analog output 214 of the DAC 208 is connected to a resistor R1 and the input of a voltage mode op-amp RC biquadratic filter 210. Current from the analog output 214 of the DAC 208 is converted to a voltage by the resistor R1. This voltage is applied to the input of the voltage mode op-amp RC biquadratic filter 210. The voltage mode op-amp RC biquadratic filter 210 typically is used to filter high frequency noise created by the DAC 208. However, the operation of op-amp filters may create high frequency noise that passes to a mixer. Other low-pass filters may be more desirable as a result of the high frequency noise created by a voltage mode op-amp RC biquadratic filter 210.

After a portion of the high frequency noise has been filtered out by the voltage mode op-amp RC biquadratic filter 210, a voltage is applied to the gates of NFET (N-type Metal Oxide Semiconductor Field Effect Transistor) MF1 and NFET MF2. NFETs MF1 and MF2 are part of a double-balanced mixer (Gilbert cell) 202. The NFETs MF1 and MF2 form gain stages for converting voltage to current. The conversion of voltage to current by NFETs MF1 and MF2 can be non-linear. Because the conversion of voltage to current by NFETs MF1 and MF2 can be a non-linear, the signal being up-converted by an analog polar transmitting circuit 200 may be distorted.

The voltage swing on node 216 should be small in order to lower distortion. The bias current through NFETs MF1 and MF2 may be high in order to achieve a desired output power for the antenna 212.

Figure 3:
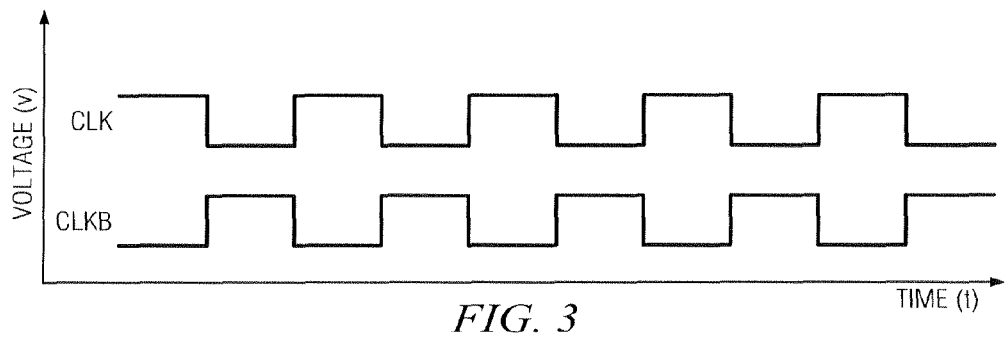
FIG. 3 is a plot of a first clock signal and second clock signal.

FIG. 3 is a plot of a first clock signal CLK and second clock signal CLKB. The first clock signal CLK and the second clock signal CLKB are square waves having substantially the same magnitude in voltage and substantially the same period. However, the first clock signal CLK and the second clock signal CLKB are approximately 180 degrees out of phase. Clock signals CLK and CLKB are generated by a phase modulated clock wherein the phase of an analog polar signal modulates the clock. Because a polar architecture is used in this example, the clock signals, CLK and CLKB contain phase modulation. The clock signals CLK and CLKB are not limited to square waves. For example, sinusoidal waves may be used.

In FIG. 2, the gates of NFETs MF3 and MF6 are connected to clock signal CLK. The gates of NFETs MF4 and MF5 are connected to clock signal CLKB. The double-balanced mixer (Gilbert cell) 202 up-converts the analog signal on node 216 to a higher frequency analog signal that drives load 204. In this example, load 204 comprises two "legs". One leg 234 is connected to an output 222 of the double-balanced mixer 202 and the other leg 236 is connected to an output 224 of the double-balanced mixer 202. The first leg 234 comprises an inductor L1 and capacitors C1, C2, and C5. The second leg 236 comprises an inductor L2 and capacitors C3, C4, and C6. The load 204 is not limited to the reactive components show in FIG. 2; other configurations, including resistors, may be used for loading.

The outputs 222 and 224 of the double-balanced mixer 202 are connected to a primary coil of a balun 206. A balun 206 may be external to an integrated circuit (IC) containing the analog polar transmitting circuit 200 or is the balun 206 may be contained on the integrated circuit (IC). The up-converted signal then magnetically drives the secondary coil of the balun 206. The secondary coil is connected to an antenna 212 and ground.

The balun 206 converts a differential signal produced by outputs 222 and 224 into a single-ended signal that drives the antenna 212. The antenna transmits the analog signal. An external balun 206 or an internal balun can be an expensive part of an analog polar transmitting circuit 200. Removing a balun 206 reduces the cost of an analog polar transmitting circuit 200.

Figure 4:
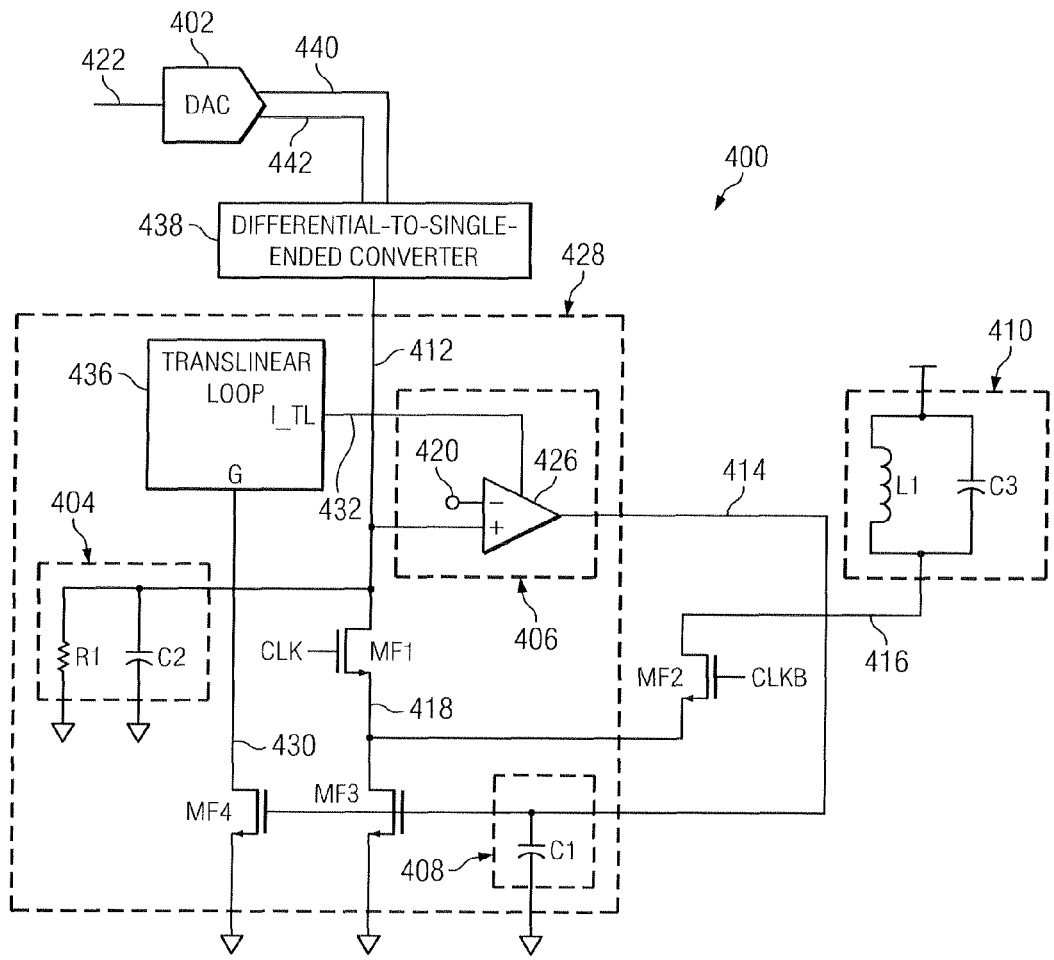
FIG. 4 is a first embodiment of a single-ended polar transmitting circuit.

FIG. 4 is a first exemplary embodiment of a single-ended polar transmitting circuit 400. In this first exemplary embodiment, the differential analog output 440 and 442 of a DAC 402 are connected to a differential-to-single-ended converter 438. The output 412 of the differential-to-single-ended converter 438 is connected to the input of a first gain stage 406, the input of a first filter 404 and the first I/O of a first switching device MF1. The DAC 402 has a digital input 422. The output 414 of the first gain stage 406 is connected to the input of the second gain stage MF3, to the input of the second filter 408 and to the input of the current mirror MF4. The output of the load 410 is connected to the first I/O of the second switching device MF2. The input to the load 410 is connected to Vdd.

The second I/O of the first switching device MF1 is connected to the second I/O of the second switching device MF2 and the first I/O of the second gain stage MF3. Clock signal CLK drives the input of the first switching device MF1 and clock signal CLKB drives the input of the second switching device MF2. The output of the first filter 404, the output of the second filter 408, the second I/O of the second gain stage MF3, and the second I/O of the current mirror MF4 are connected to ground.

In this first exemplary embodiment of a single-ended polar transmitting circuit 400, the first filter 404 comprises a resistor R1 and a capacitor C2 connected between the input and the output of the first filter 404. However, other filter configurations may be used to implement the first filter 404. In this first exemplary embodiment of a single-ended polar transmitting circuit 400, the second filter 408 comprises a capacitor C1 connected between the input and the output of the second filter 408. However, other filter configurations may be used to implement the second filter 408. In this first exemplary embodiment of a single-ended polar transmitting circuit 400, the load 410 comprises a inductor L1 and a capacitor C3 connected between the input and the output of the load 410. However, other load configurations may be used to implement the load 410.

In this first exemplary embodiment of a single-ended polar transmitting circuit 400, the first gain stage 406 comprises an transconductor 426 wherein a first input to the transconductor 426 is connected to a DC (direct current) voltage and another input to the transconductor 426 is connected to the output 412 of the DAC 402. A translinear loop 436 is connected to the transconductor 426 through node 432. The output of the transconductor 426 is connected to the output 414 of the first gain stage 406. Other gain stages may be used to implement the first gain stage 406.

In this first exemplary embodiment of a single-ended polar is transmitting circuit 400, the second gain stage MF3 comprises a NFET MF3 wherein the first I/O of the second gain stage is connected to the drain of NFET MF3, the second I/O of the second gain stage is connected to the source of NFET MF3 and the input of the second gain stage is connected to the gate of NFET MF3. However, other transistor types such as bipolar and JFETs (Junction Field Effect Transistor) may be used as a gain stage. In this first exemplary embodiment of a single-ended polar transmitting circuit 400, the first gain stage has a transconductance Gm1 and the second gain stage has a transconductance Gm2.

The gain stage MF3 is mirrored by the current mirror MF4. The current conducted through the current mirror MF4 is proportional to the current conducted through gain stage MF3. The current conducted through node 418, due to the translinear loop 436 operation and the gain in the translinear loop 436, will balance to be substantially equal to the DAC current conducted through node 412 within the bandwith of the GmC filter 428.

The mirror device MF4 is connected to the translinear loop 436 at node 430. One function of the translinear loop 432 is to generate a current though node 432 into transconductor 426 that is inversely proportional to the current conducted through the current mirror MF4. Because the current mirror MF4 mirrors the current through gain stage MF3, the current conducted through node 432 into the transconductor 426 is also inversely proportional to the current conducted through the gain stage MF3.

Figure 7:
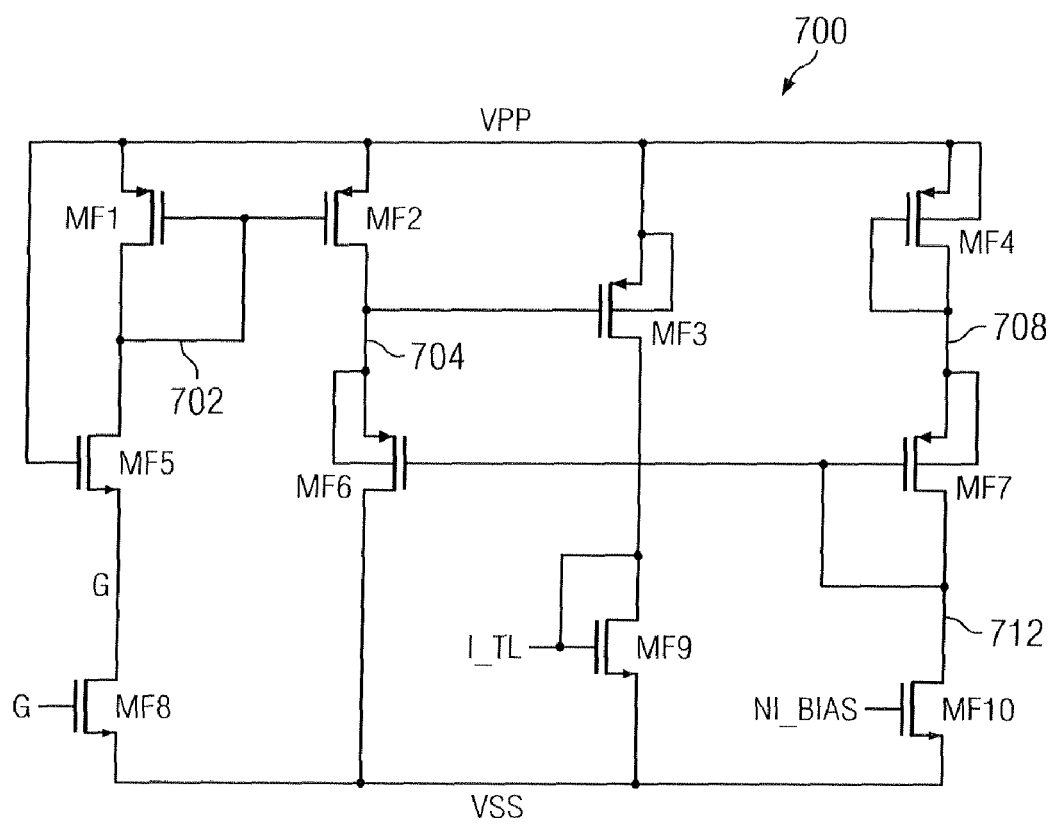
FIG. 7 is an embodiment of a translinear loop.

FIG. 7 is an example of a translinear loop 700. FIG. 7 includes 10 MOSFETs (Metal Oxide Semiconductor Field Effect Transistors). The sources of P-type MOSFETs MF1, MF2, MF3 and MF4 are connected to voltage reference VDD. The bodies of P-type MOSFETs MF3 and MF4 are connected to voltage reference VDD. The gate of MF5 is connected to voltage reference VDD. The sources of N-type MOSFETs MF8, MF9 and MF10 are connected to voltage reference VSS. The drain of MF6 is connected to voltage reference Vss.

In FIG. 7, the drain of MF5, the gate and drain of MF1 and the gate of MF2 are connected to node 702. The drain of MF2, the gate of MF3 and the source and body of MF6 are connected are connected to node 704. The drain of MF3 and the gate and drain of MF9 are connected to output I_TL of translinear loop 700. The gate and drain of MF4 and the source and body of MF7 are connected to node 708. The source of MF5 and the drain of MF8 are connected to input G. The drain and gate of MF7, the gate of MF6 and the drain of MF10 are connected to node 712. The gate of MF8 is connected to input G of the translinear loop 700. The gate of MF10 is connected to DC bias N1_bias.

The current conducted through node 432 into the transconductor 426 also controls the transconductance gain of the transconductor 426. Because the current conducted through node 432 into the transconductor 426 controls the transconductance gain of the transconductor 426, the transconductance Gm1 of the transconductor 426 is proportional to the square root of the current conducted through node 432. The square root relationship explained previously is due primarily to the fact that a MOS (Metal Oxide Semiconductor) differential transconductor 426 is used in this example.

The transconductance Gm1 of the transconductor 426 and the transconductance Gm2 of gain stage MF3 control the bandwidth of the GmC filter 428. The bandwidth of GmC filter 428 is proportional to the product of Gm1 and Gm2 (i.e. Gm1*Gm2). Since the transconductance Gm2 of gain stage MF3 is proportional to the square root of the current conducted through node 418, the product of Gm1 and Gm2 is a constant and has no dependency on the current conducted through node 418 or the current through node 412, the DAC current.

In this first exemplary embodiment of a single-ended polar transmitting circuit 400, the first switching device MF1 comprises a NFET MF1 wherein the first I/O of the first switching device MF1 is connected to the drain of NFET MF1, the second I/O of the first switching device is connected to the source of NFET MF1 and the input of the first switching device is connected to the gate of NFET MF1. However, other transistor types such as bipolar and JFETs may be used as switching devices. In this first exemplary embodiment of a single-ended polar transmitting circuit 400, the second switching device MF2 comprises a NFET MF2 wherein the first I/O of the first switching device MF2 is connected to the drain of NFET MF2, the second I/O of the second switching device MF2 is connected to the source of NFET MF2 and the input of the second switching device MF2 is connected to the gate of NFET MF2. However, other transistor types such as bipolar and JFETs may be used as switching devices.

In this first exemplary embodiment of a single-ended polar transmitting circuit 400, a GmC filter 428 comprises the first gain stage 406, the second gain stage MF3, the first filter 404, the second filter 408, the translinear loop 436, current mirror MF4 and switching device MF1. The GmC filter 428 has a bandwidth defined by the square root of the quantity (Gm1*Gm2)/(C1*C2). GmC filters have lower out-of-band noise when compared to op-amp RC filters.

In this first exemplary embodiment of a single-ended polar transmitting circuit 400, when clock signal CLK is low and clock signal CLKB is high, current is conducted through the load 410, NFET MF2, and NFET MF3. During this period, an antenna may be driven. When an antenna is driven, an up-converted analog signal may be transmitted by the antenna. In this exemplary embodiment, a balun is not necessary because the up-converted signal is single-ended, not differential as in FIG. 2.

In this first exemplary embodiment of a single-ended polar transmitting circuit 400, when clock signal CLK is high and clock signal CLKB is low, current is feedback through NFET MF1, and NFET MF3 into the analog output 412 of the DAC 402. As explained previously because a translinear loop 436 is used, the DAC signal 412 has lower noise and is more linear. In addition, the bandwidth of the GmC filter 428 is substantially constant.

In this first exemplary embodiment of a single-ended polar transmitting circuit 400, the area required to implement a single-ended polar transmitting circuit would be smaller than would be required by the analog polar transmitting circuit shown in FIG. 2.

Figure 5:
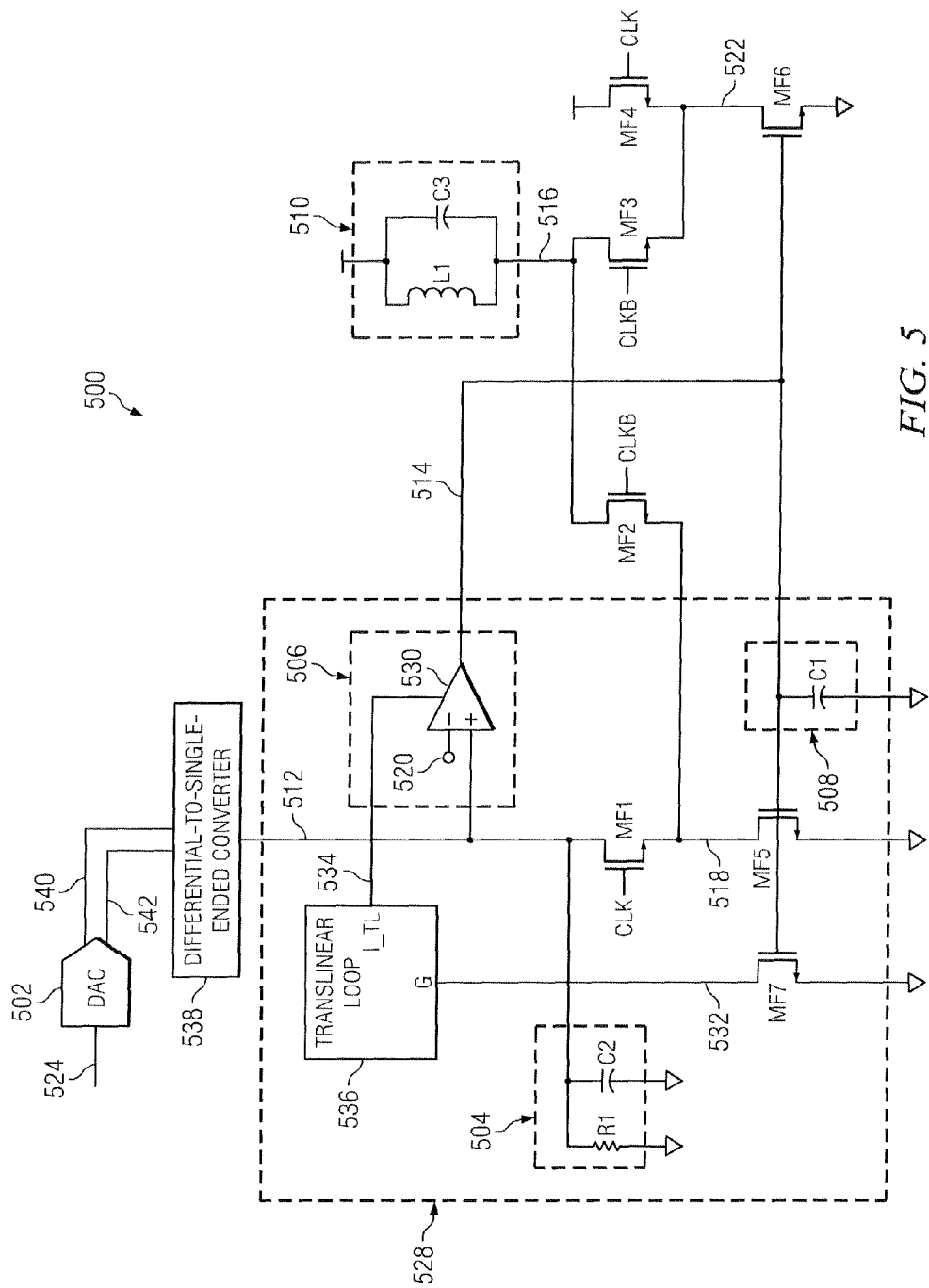
FIG. 5 is a second embodiment of a single-ended polar transmitting circuit.

FIG. 5 is a second exemplary embodiment of a single-ended is polar transmitting circuit 500. In this second exemplary embodiment, the differential analog output 540 and 542 of a DAC 502 is connected to a differential-to-single-ended converter 538. The output 512 of the differential-to-single-ended converter 538 is connected to the input of a first gain stage 506, the input of a first filter 504 and the first I/O of a first switching device MF1. The DAC 502 has a digital input 524. The output 514 of the first gain stage 506 is connected to the input of the second gain stage MF5, to the input of the third gain stage MF6, the input of the current mirror MF7 and to the input of the second filter 508. The output 516 of the load 510 is connected to the first I/O of the second switching device MF2 and the first I/O of the third switching device. The input to the load 510 and the first I/O of switching device MF4 are connected to Vdd.

The second I/O of the first switching device MF1 is connected to the second I/O of the second switching device MF2 and the first I/O of the second gain stage MF5. The second I/O of the third switching device MF3 is connected to the second I/O of the fourth switching device MF4 and the first I/O of the third gain stage MF6. Clock signal CLK drives the input of the first switching device MF1 and the input of the fourth switching device MF4. Clock signal CLKB drives the input of the second switching device MF2 and the input of the third switching device MF3. The output of the first filter 504, the output of the second filter 508, the second I/O of the second gain stage MF5, the second I/O of the current mirror MF7 and the second I/O of the third gain stage MF6 are connected to ground.

In this second exemplary embodiment of a single-ended polar is transmitting circuit 500, the first filter 504 comprises a resistor R1 and a capacitor C2 connected between the input and the output of the first filter 504. However, other filter configurations may be used to implement the first filter 504. In this second exemplary embodiment of a single-ended polar transmitting circuit 500, the second filter 508 comprises a capacitor C1 connected between the input and the output of the second filter 508. However, other filter configurations may be used to implement the second filter 508. In this second exemplary embodiment of a single-ended polar transmitting circuit 500, the load 510 comprises an inductor L1 and a capacitor C3 connected between the input and the output of the load 510. However, other load configurations may be used to implement the load 510.

In this second exemplary embodiment of a single-ended polar transmitting circuit 500, the first gain stage 506 comprises an transconductor 530 wherein a first input 520 to the transconductor 530 is connected to a DC (direct current) voltage and another input to the transconductor 530 is connected to the output 512 of the differential-to-single-ended converter 538. A translinear loop 536 is connected to the transconductor 530 through node 534. The output of the transconductor 530 is connected to the output 514 of the first gain stage 506. However, other gain stages may be used to implement the first gain stage 506.

The gain stage MF5 is mirrored by the current mirror MF7. The current conducted through the current mirror MF7 is proportional to the current conducted through gain stage MF5. The current conducted through node 518, due to the translinear loop 536 operation and the gain in the translinear loop 536, will balance to be substantially equal to the DAC current conducted through node 512 within the bandwith of the GmC filter 528.

The mirror device MF7 is connected to the translinear loop 536 at node 532. One function of the translinear loop 536 is to generate a current though node 534 into transconductor 530 that is inversely proportional to the current conducted through the current mirror MF7. Because the current mirror MF7 mirrors the current through gain stage MF5, the current conducted through node 534 into the transconductor 530 is also inversely proportional to the current conducted through the gain stage MF5.

The current conducted through node 534 into the transconductor 530 also controls the transconductance gain of the transconductor 530. Because the current conducted through node 534 into the transconductor 530 controls the transconductance gain of the transconductor 530, the transconductance Gm1 of the transconductor 530 is proportional to the square root of the current conducted through node 534. The square root relationship explained previously is due primarily to the fact that a MOS (Metal Oxide Semiconductor) differential transconductor 530 is used in this example.

The transconductance Gm1 of the transconductor 530 and the transconductance Gm2 of gain stage MF5 control the bandwidth of the GmC filter 528. The bandwidth of GmC filter 528 is proportional to the product of Gm1 and Gm2 (i.e. Gm1*Gm2). Since the transconductance Gm2 of gain stage MF5 is proportional to the square root of the current conducted through node 518, the product of Gm1 and Gm2 is substantially a constant and has no dependency on the current conducted through node 518 or the current through node 512, the DAC current.

In this second exemplary embodiment of a single-ended polar transmitting circuit 500, the second gain stage MF5 comprises a NFET MF5 wherein the first I/O of the second gain stage is connected to the drain of NFET MF5, the second I/O of the second gain stage is connected to the source of NFET MF5 and the input of the second gain stage is connected to the gate of NFET MF5. However, other transistor types such as bipolar and JFETs may be used as a gain stage. In this second exemplary embodiment of a single-ended polar transmitting circuit 500, the third gain stage MF6 comprises a NFET MF6 wherein the first I/O of the third gain stage is connected to the drain of NFET MF6, the second I/O of the third gain stage is connected to the source of NFET MF6 and the input of the third gain stage is connected to the gate of NFET MF6. However, other transistor types such as bipolar and JFETs may be used as a gain stage. In this second exemplary embodiment of a single-ended polar transmitting circuit 500, the first gain stage has a transconductance Gm1 and the second gain stage has a transconductance Gm2.

In this second exemplary embodiment of a single-ended polar transmitting circuit 500, the first switching device MF1 comprises a NFET MF1 wherein the first I/O of the first switching device MF1 is connected to the drain of NFET MF1, the second I/O of the first switching device is connected to the source of NFET MF1 and the input of the first switching device is connected to the gate of NFET MF1. However, other transistor types such as bipolar and JFETs may be used as switching devices. In this second exemplary embodiment of a single-ended polar transmitting circuit 500, the second switching device MF2 comprises a NFET MF2 wherein the first I/O of the second switching device MF2 is connected to the drain of NFET MF2, the second I/O of the second switching device MF2 is connected to the source of NFET MF2 and the input of the second switching device MF2 is connected to the gate of NFET MF2. However, other transistor types such as bipolar and JFETs may be used as switching devices.

In this second exemplary embodiment of a single-ended polar transmitting circuit 500, the third switching device MF3 comprises a NFET MF3 wherein the first I/O of the third switching device MF3 is connected to the drain of NFET MF3, the second I/O of the third switching device is connected to the source of NFET MF3 and the input of the third switching device is connected to the gate of NFET MF3. However, other transistor types such as bipolar and JFETs may be used as switching devices. In this second exemplary embodiment of a single-ended polar transmitting circuit 500, the fourth switching device MF4 comprises a NFET MF4 wherein the first I/O of the fourth switching device MF4 is connected to the drain of NFET MF4, the second I/O of the fourth switching device MF4 is connected to the source of NFET MF4 and the input of the fourth switching device MF4 is connected to the gate of NFET MF4. However, other transistor types such as bipolar and JFETs may be used as switching devices.

In this second exemplary embodiment of a single-ended polar transmitting circuit 500, a GmC filter 528 comprises the first gain stage 506, the second gain stage MF5, the first filter 504, the second filter 508, translinear loop 536, current mirror MF7 and switching device MF1. The GmC filter 528 has a bandwidth defined by the square root of the quantity (Gm1*Gm2)/(C1*C2). GmC filters have lower out-of-band noise when compared to op-amp RC filters.

In this second exemplary embodiment of a single-ended polar transmitting circuit 500, when clock signal CLK is low and clock signal CLKB is high, a first current is conducted through the load 510, NFET MF3, and NFET MF5 and a second current is conducted through the load 510. NFET MF3, and NFET MF6. During this period, an antenna may be driven. When an antenna is driven, an up-converted analog signal may be transmitted by the antenna. In this exemplary embodiment a balun is not necessary because the up-converted signal is single-ended, not differential as in FIG. 2.

In this second exemplary embodiment of a single-ended polar transmitting circuit 500, when clock signal CLK is high and clock signal CLKB is low, current is feedback through NFET MF1, and NFET MF5 into the analog output 512 of the DAC 502. As explained previously because a translinear loop 536 is used, the DAC signal 512 has lower noise and is more linear. In addition the bandwidth of the GmC filter 528 is substantially constant.

In this second exemplary embodiment of a single-ended polar transmitting circuit 500, when clock signal CLK is high and clock signal CLKB is low, RF (radio frequency) current is conducted through NFET MF4, and NFET MF6 into power supply Vdd. Often, the current required to drive the load 510 is greater than the current required as feedback. For at least this reason, current is conducted through NFET MF4, and NFET MF6 into power supply Vdd when clock signal CLK is high and clock signal CLKB is low. When less current is required for feedback into the output 512 of the DAC is 502, the area of the DAC and GmC filter 528 may be reduced. In addition, when less current is required for feedback into the output 512 of the DAC 502 noise may be reduced.

Figure 6:
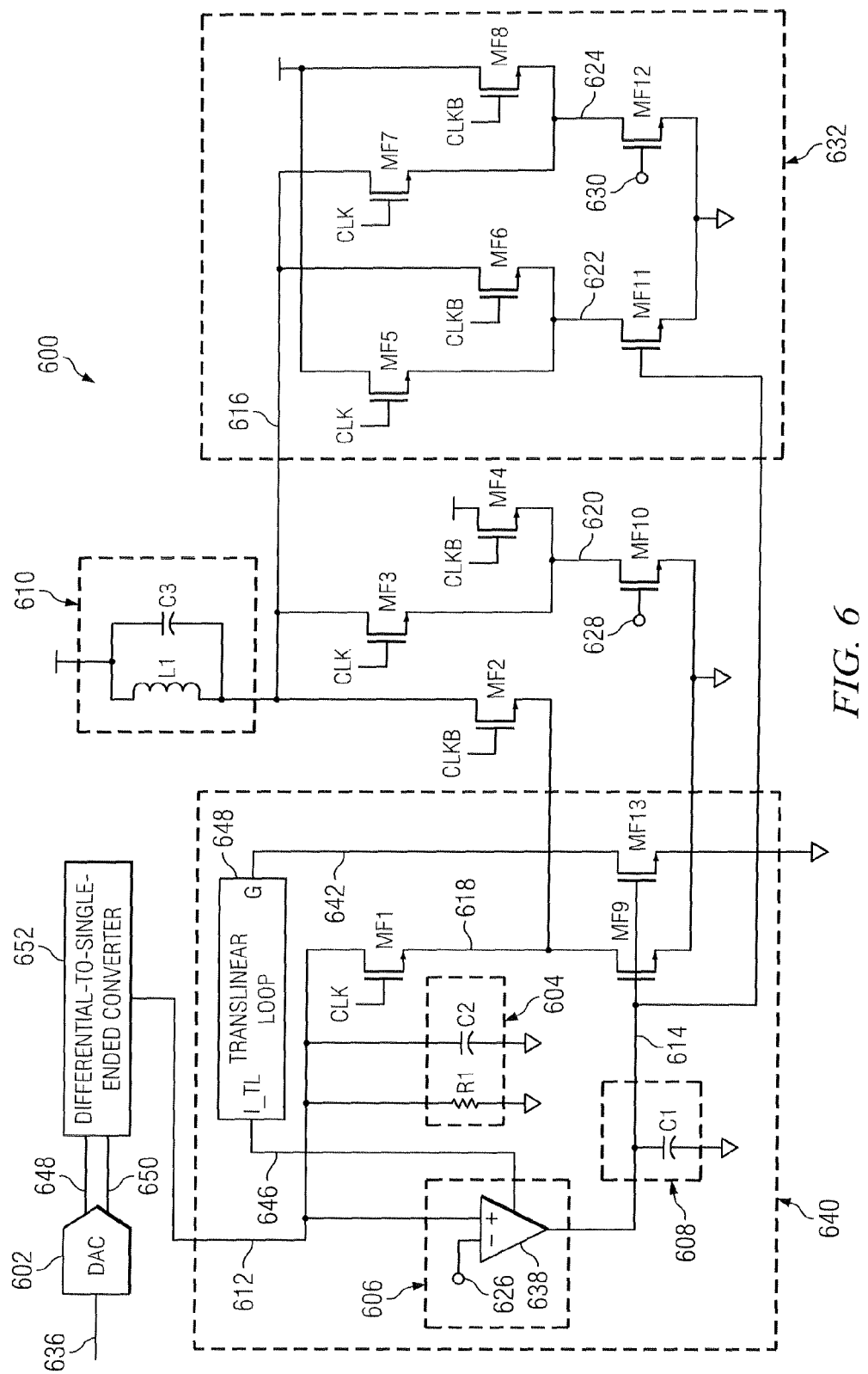
FIG. 6 is a third embodiment of a single-ended polar transmitting circuit.

FIG. 6 is a third exemplary embodiment of a single-ended polar transmitting circuit 600. In this third exemplary embodiment, the differential analog output 648 and 650 of a DAC 602 is connected to a differential-to-single-ended converter 652. The output 612 of the differential-to-single-ended converter 652 is connected to an input of a first gain stage 606, the input of a first filter 604 and the first I/O of a first switching device MF1. The DAC 602 has a digital input 636. The output 614 of the first gain stage 606 is connected to the input of the second gain stage MF9, to the input of the fourth gain stage MF11, the input of the current mirror MF13 and to the input of the second filter 608. The output 616 of the load 610 is connected to the first I/O of the second switching device MF2, the first I/O of the third switching device MF3, the first I/O of the sixth switching device MF6 and the first I/O of the seventh switching device MF7. The input to the load 410 is connected to Vdd.

The second I/O of the first switching device MF1 is connected to the second I/O of the second switching device MF2 and the first I/O of the second gain stage MF9. The second I/O of the third switching device MF3 is connected to the second I/O of the four switching device MF4 and the first I/O of the third gain stage MF10. The second I/O of the fifth switching device MF5 is connected to the second I/O of the sixth switching device MF6 and the first I/O of the fourth gain stage MF11. The second I/O of the seventh switching device MF7 is connected to the second I/O of the eighth switching device MF8 and the first I/O of the fifth gain stage MF12.

Clock signal CLK drives the input of the first switching device MF1, the input of the third switching device MF3, the input of the fifth switching device MF5 and the input of the seventh switching device MF7. Clock signal CLKB drives the input of the second switching device MF2, the input of the fourth switching device MF4, the input of the sixth switching device MF6 and the input of the eighth switching device MF8.

The output of the first filter 604, the output of the second filter 608, the second I/O of the second gain stage MF9, the output of the current mirror MF13, the second I/O of the third gain stage MF10, the second I/O of the fourth gain stage MF11 and the second I/O of the fifth gain stage MF12 are connected to ground. The first I/O of switching device MF4, the first I/O of switching device MF5, the first I/O of switching device MF8 and the input of the load 610 are connected to Vdd.

In this third exemplary embodiment of a single-ended polar transmitting circuit 600, the first filter 604 comprises a resistor R1 and a capacitor C2 connected between the input and the output of the first filter 604. However, other filter configurations may be used to implement the first filter 604. In this third exemplary embodiment of a single-ended polar transmitting circuit 600, the second filter 608 comprises a capacitor C1 connected between the input and the output of the second filter 608. However, other filter configurations may be used to implement the second filter 608. In this third exemplary embodiment of a single-ended polar transmitting circuit 600, the load 610 comprises an inductor L1 and a capacitor C3 connected between the input and the output of the load 610. However, other load configurations may be used to implement the load 610.

In this third exemplary embodiment of a single-ended polar transmitting circuit 600, the first gain stage 606 comprises an transconductor 638 wherein a first input to the transconductor 638 is connected to a DC (direct current) voltage and another input to the transconductor 638 is connected to the output 612 of the DAC 602. A translinear loop 648 is connected to the transconductor 638 through node 646. The output of the transconductor 638 is connected to the output 614 of the first gain stage 606. However, other gain stages may be used to implement the first gain stage 606.

The gain stage MF9 is mirrored by the current mirror MF13. The current conducted through the current mirror MF13 is proportional to the current conducted through gain stage MF9. The current conducted through node 618, due to the translinear loop 648 operation and the gain in the translinear loop 648, will balance to be substantially equal to the DAC current conducted through node 612 within the bandwidth of the GmC filter 640.

The mirror device MF13 is connected to the translinear loop 648 at node 642. One function of the translinear loop 648 is to generate a current though node 646 into transconductor 638 that is inversely proportional to the current conducted through the current mirror MF13. Because the current mirror MF13 mirrors the current through gain stage MF9, the current conducted through node 646 into the transconductor 638 is also inversely proportional to the current conducted through the gain stage MF9.

The current conducted through node 646 into the transconductor 638 also controls the transconductance gain of the transconductor 638. Because the current conducted through node 646 into the transconductor 638 controls the transconductance gain of the transconductor 638, the transconductance Gm1 of the transconductor 646 is proportional to the square root of the current conducted through node 646. The square root relationship explained previously is due primarily to the fact that a MOS (Metal Oxide Semiconductor) differential transconductor 638 is used in this example.

The transconductance Gm1 of the transconductor 638 and the transconductance Gm2 of gain stage MF9 control the bandwidth of the GmC filter 640. The bandwidth of the GmC filter 640 is proportional to the product of Gm1 and Gm2 (i.e. Gm1*Gm2). Since the transconductance Gm2 of gain stage MF9 is proportional to the square root of the current conducted through node 618, the product of Gm1 and Gm2 is substantially a constant and has no dependency on the current conducted through node 618 or the current through node 612, the DAC current.

In this third exemplary embodiment of a single-ended polar transmitting circuit 600, the second gain stage MF9 comprises a NFET MF9 wherein the first I/O of the second gain stage MF9 is connected to the drain of NFET MF9, the second I/O of the second gain stage MF9 is connected to the source of NFET MF9 and the input of the second gain stage MF9 is connected to the gate of NFET MF9. However, other transistor types such as bipolar and JFETs may be used as a gain stage. In this third exemplary embodiment of a single-ended polar transmitting circuit 600, the third gain stage MF10 comprises a NFET MF10 wherein the first I/O of the third gain stage MF10 is connected to the drain of NFET MF10, the second I/O of the third gain stage MF10 is connected to the source of NFET MF10 and the input of the third gain stage MF10 is connected to the gate of NFET MF10. However, other transistor types such as bipolar and JFETs may be used as a gain stage. In this third exemplary embodiment of a single-ended polar transmitting circuit 600, the first gain stage 606 has a transconductance Gm1 and the second gain stage MF9 has a transconductance Gm2.

In this third exemplary embodiment of a single-ended polar transmitting circuit 600, the fourth gain stage MF11 comprises a NFET MF11 wherein the first I/O of the second gain stage MF11 is connected to the drain of NFET MF11, the second I/O of the second gain stage MF11 is connected to the source of NFET MF11 and the input of the second gain stage MF11 is connected to the gate of NFET MF11. However, other transistor types such as bipolar and JFETs may be used as a gain stage. In this third exemplary embodiment of a single-ended polar transmitting circuit 600, the fifth gain stage MF12 comprises a NFET MF12 wherein the first I/O of the fifth gain stage MF12 is connected to the drain of NFET MF12, the second I/O of the fifth gain stage MF12 is connected to the source of NFET MF12 and the input of the fifth gain stage MF12 is connected to the gate of NFET MF12. However, other transistor types such as bipolar and JFETs may be used as a gain stage.

In this third exemplary embodiment of a single-ended polar transmitting circuit 600, the switching devices MF1-MF8 comprise NFETs as shown in FIG. 6. However, other transistor types such as bipolar and JFETs may be used as switching devices.

In this third exemplary embodiment of a single-ended polar transmitting circuit 600, a GmC filter 640 comprises the first gain stage 606, the second gain stage MF9, the first filter 604, the second filter 608, the current mirror MF13, the translinear loop 648 and switching device MF1. The GmC filter 640 has a bandwidth (BW) defined by the square root of the quantity $(Gm1*Gm2)/(C1*C2)$. GmC filters have lower out-of-band noise when compared to op-amp RC filters.

In this third exemplary embodiment of a single-ended polar transmitting circuit 600, when clock signal CLK is low and clock signal CLKB is high, a first current is conducted through the load 610, NFET MF2, and NFET MF9 and a second current is conducted through the load 610, NFET MF6, and NFET MF11. During this period, an antenna may be driven. When an antenna is driven, an up-converted analog signal may be transmitted by the antenna. In this exemplary embodiment, a balun is not necessary because the up-converted signal is single-ended, not differential as in FIG. 2.

In this third exemplary embodiment of a single-ended polar transmitting circuit 600, when clock signal CLK is high and clock signal CLKB is low, current is fed back through NFET MF1, and NFET MF9 into the analog output 612 of the DAC 602. As explained previously because a translinear loop 648 is used, the DAC signal 612 has lower noise and is more linear. In addition, the bandwidth of the GmC filter 640 is substantially constant.

In this third exemplary embodiment of a single-ended polar transmitting circuit 600, when clock signal CLK is high and clock signal CLKB is low, current is conducted through NFET MF5, and NFET MF11 into power supply Vdd. Often, the current required to drive the load 610 is greater than the current required as feedback current. For at least this reason, current is conducted through NFET MF5, and NFET MF11 into power supply Vdd when clock signal CLK is high and clock signal CLKB is low. When less current is required for feedback into the output 612 of the DAC 602, the area of the DAC 602 and GmC filter 640 may be reduced. In addition, when less current is required for feedback into the output 612 of the DAC 602 noise may be reduced.

One reason for adding the circuitry shown in box 632 is that the circuitry shown in box 632 helps to balance the load seen by clocks CLK and CLKB. Balancing the load seen by clocks CLK and CKLB reduces clock feed-through. Reducing clock feed-through improves the linearity of the transmitted signal.

In the third embodiment, a DC bias is added to the DAC signal on node 612. Adding a DC bias to the DAC signal current keeps the transconductance Gm2 of MF9 above the cut-off region of operation. This DC bias is also added to nodes 628 and 630. Adding the DC bias to nodes 628 and 630 cancels the DC bias added to the DAC signal during the generation of the RF signal.

The foregoing description has been presented for purposes of illustration and description. It is not intended to be exhaustive or to limit the invention to the precise form disclosed, and other modifications and variations may be possible in light of the above teachings. The exemplary embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A single-ended polar transmitting circuit comprising:
   a DAC;
   a differential-to-single-ended converter;
   a GmC filter, the GmC filter comprising:
     a first and a second gain stage;
     a first filter, the first filter comprising a resistor R1 and a first capacitor C1;
     a second filter, the second filter comprising a capacitor C2;
     a translinear loop;
     a current mirror;
     a first switching device;
     wherein the first gain stage has a transconductance Gm1 and the second gain stage has a transconductance Gm2;
     wherein the bandwidth of the GmC filter is approximately equal to the square root of the quantity $(Gm1*Gm2)/(C1*C2)$;
   a load device;
   wherein the bandwidth of the GmC filter is substantially a constant value.

2. The single-ended polar transmitting circuit of claim 1 further comprising:
   a second switching device;
   a first clock signal and a second clock signal wherein the first clock signal is approximately 180 degrees out of phase from the second clock signal;
   wherein a first current is conducted through the load, through the second switching device and through the second gain stage when the second clock signal is high;
   wherein a second current is conducted through the first switching device and through the second gain stage when the first clock signal is high.

3. The single-ended polar transmitting circuit of claim 2 wherein the DAC further comprises an input and a differential output;
   wherein the differential-to-single-ended converter further comprises a differential input and a single output;
   wherein the first gain stage has a first input, a second input and an output;
   wherein the second gain stage has a first input, a first I/O, and a second I/O;
   wherein the first filter has an input and an output;
   wherein the second filter has an input and an output;
   wherein the first switching device has an first input, a first I/O and a second I/O;
   wherein the second switching device has a first input, a first I/O and a second I/O;
   wherein the current mirror has an input, a first I/O and a second I/O;
   wherein the transfer loop has a first I/O and a second I/O;
   wherein the load has an input and an output;

wherein the differential output of the DAC is connected to the differential input of the differential-to-single-ended converter;
wherein the output of the differential-to-single-ended converter is connected to the input of the first filter, the first input of the first gain stage and the first I/O of the first switching device;
wherein the output of the first gain stage is connected to the input of the second gain stage, the input of the current mirror and the input of the second filter;
wherein the output of the load is connected to the first I/O of the second switching device;
wherein the first I/O of the second gain stage is connected to the second I/O of the first switching device and to the second I/O of the second switching device;
wherein the first I/O of the translinear loop is connected to the second input of the first gain stage;
wherein the second I/O of the translinear loop is connected to the first I/O of the current mirror;
wherein the first clock signal is connected to the input of the first switching device;
wherein the second clock signal is connected to the input of the second switching device;
wherein a ground is connected to the output of the first filter, the output of the second filter, the second I/O of the second gain stage and the second I/O of the current mirror;
wherein the input of the load is connected to a voltage reference.

4. The single-ended polar transmitting circuit of claim 3 wherein the resistor R1 has a first and second connection;
wherein the capacitor C1 has a first and a second connection;
wherein the first connection on the resistor R1 is connected to the input of the first filter;
wherein the second connection on the resistor R1 is connected to the output of the first filter;
wherein the first connection on the capacitor C1 is connected to the input of the first filter;
wherein the second connection on the capacitor C1 is connected to the output of the first filter.

5. The single-ended polar transmitting circuit of claim 3 wherein the capacitor C2 has a first and second connection;
wherein the first connection on the capacitor C2 is connected to the input of the second filter;
wherein the second connection on the capacitor C2 is connected to the output of the second filter.

6. The single-ended polar transmitting circuit of claim 3 wherein the load further comprises:
a capacitor, the capacitor having a first and a second connection;
wherein the first connection on the capacitor is connected to the input of the load;
wherein the second connection on the capacitor is connected to the output of the load;
an inductor, the inductor having a first and a second connection;
wherein the first connection on the inductor is connected to the input of the load;
wherein the second connection on the inductor is connected to the output of the load.

7. The single-ended polar transmitting circuit of claim 3 wherein the first gain stage further comprises:
a transconductor, the transconductor having a first input, a second input, a third input and an output;
wherein the first input of the transconductor is connected to a first input of the first gain stage;
wherein the second input of the transconductor is connected to a DC voltage;
wherein the third input of the transconductor is connected to the second input of the first gain stage;
wherein the output of the transconductor is connected to an output of the first gain stage.

8. The single-ended polar transmitting circuit of claim 3 wherein the first switching device, the second switching device, the current mirror and the second gain stage are NFETs;
wherein the first I/O of the first switching device is connected to a drain of a first NFET;
wherein the second I/O of the first switching device is connected to a source of the first NFET;
wherein the input of the first switching device is connected to a gate of the first NFET;
wherein the first I/O of the second switching device is connected to a drain of a second NFET;
wherein the second I/O of the second switching device is connected to a source of the second NFET;
wherein the input of the second switching device is connected to a gate of the second NFET;
wherein the first I/O of the current mirror is connected to a drain of a third NFET;
wherein the second I/O of the current mirror is connected to a source of the third NFET;
wherein the input of the current mirror is connected to a gate of the third NFET;
wherein the first I/O of the second gain stage is connected to a drain of a fourth NFET;
wherein the second I/O of the second gain stage is connected to a source of the fourth NFET;
wherein the input of the second gain stage is connected to a gate of the fourth NFET.

9. A single-ended polar transmitting circuit comprising:
a DAC;
a differential-to-single-ended converter;
a first, a second and a third switching device;
a first gain stage;
a GmC filter, the GmC filter comprising:
a second and a third gain stage;
a first filter, the first filter comprising a resistor R1 and a first capacitor C1;
a second filter, the second filter comprising a capacitor C2;
a translinear loop;
a current mirror;
a fourth switching device;
wherein the second gain stage has a transconductance Gm1 and the third gain stage has a transconductance Gm2;
wherein the bandwidth of the GmC filter is approximately equal to the square root of the quantity (Gm1*Gm2)/(C1*C2);
a load device;
wherein the bandwidth of the GmC filter is substantially a constant value.

10. The single-ended polar transmitting circuit of claim 9 further comprising:
a first and a second clock signal wherein the first clock signal is approximately 180 degrees out of phase from the second clock signal;
wherein a first current is conducted from the output of the load when the second clock signal is high;
wherein a first portion of the first current is conducted through the first switching device and through the third gain stage when the second clock signal is high;

wherein a second portion of the first current is conducted through the second switching device and through the first gain stage when the second clock signal is high;
wherein a second current is conducted through the fourth switching device and through the third gain stage when the first clock signal is high; wherein the first current is greater than the second current;
wherein a third current is conducted through the third switching device and through the first gain stage when the first clock signal is high.

11. A single-ended polar transmitting circuit of claim 9 wherein the DAC further comprises an input and a differential output;
wherein the differential-to-single-ended converter further comprises a differential input and a single output;
wherein the first gain stage has a first input, a second input and an output;
wherein the second gain stage has a first input, a first I/O, and a second I/O;
wherein the third gain stage has a first input, a first I/O, and a second I/O;
wherein the first filter has an input and an output;
wherein the second filter has an input and an output;
wherein the first switching device has a first input, a first I/O and a second I/O;
wherein the second switching device has a first input, a first I/O and a second I/O;
wherein the third switching device has a first input, a first I/O and a second I/O;
wherein the fourth switching device has a first input, a first I/O and a second I/O;
wherein the current mirror has an input, a first I/O and a second I/O;
wherein the transfer loop has a first I/O and a second I/O;
wherein the load has an input and an output;
wherein the differential output of the DAC is connected to the differential input of the differential-to-single-ended converter;
wherein the output of the differential-to-single-ended converter is connected to the input of the first filter, the first input of the second gain stage and the first I/O of the fourth switching device;
wherein the output of the second gain stage is connected to the input of the third gain stage, the input of the first gain stage, the input of the current mirror and the input of the second filter;
wherein the output of the load is connected to the first I/O of the first switching device and to the first I/O of the second switching device;
wherein the first I/O of the third gain stage is connected to the second I/O of the fourth switching device and to the second I/O of the first switching device;
wherein the first I/O of the translinear loop is connected to the second input of the second gain stage;
wherein the second I/O of the translinear loop is connected to the first I/O of the current mirror;
wherein the first clock signal is connected to the input of the fourth switching device and the input of the third switching device;
wherein the second clock signal is connected to the input of the first switching device and the input of the second switching device;
wherein the second I/O of the second switching device and the second I/O of the third switching device are connected to the first I/O of the first gain stage;
wherein a ground is connected to the output of the first filter, the output of the second filter, the second I/O of the third gain stage, the second I/O of the first gain stage and the second I/O of the current mirror;
wherein the input of the load and the first I/O of the third switching device are connected to a voltage reference.

12. The single-ended polar transmitting circuit of claim 11 wherein the resistor R1 has a first and a second connection;
wherein the capacitor C1 has a first and a second connection;
wherein the first connection on the resistor R1 is connected to the input of the first filter;
wherein the second connection on the resistor R1 is connected to the output of the first filter;
wherein the first connection on the capacitor C1 is connected to the input of the first filter;
wherein the second connection on the capacitor C1 is connected to the output of the first filter.

13. The single-ended polar transmitting circuit of claim 11 wherein the second gain stage further comprises:
a transconductor, the transconductor having a first input, a second input, a third input and an output;
wherein the first input of the transconductor is connected to a first input of the second gain stage;
wherein the second input of the transconductor is connected to a DC voltage;
wherein the third input of the transconductor is connected to the second input of the second gain stage;
wherein the output of the transconductor is connected to an output of the second gain stage.

14. A single-ended polar transmitting circuit comprising:
a DAC;
a differential-to-single-ended converter;
a first, a second, a third, a fourth, a fifth, a sixth and a seventh switching device;
a first, a second and a third gain stage;
a GmC filter, the GmC filter comprising:
a fourth and a fifth gain stage;
a first filter, the first filter comprising a resistor R1 and a first capacitor C1;
a second filter, the second filter comprising a capacitor C2;
a translinear loop;
a current mirror;
an eighth switching device;
wherein the fourth gain stage has a transconductance Gm1 and the fifth gain stage has a transconductance Gm2;
wherein the bandwidth of the GmC filter is approximately equal to the square root of the quantity (Gm1*Gm2)/(C1*C2);
a load device;
wherein the bandwidth of the GmC filter is substantially a constant value.

15. The single-ended polar transmitting circuit of claim 14 further comprising:
a first and a second clock signal wherein the first clock signal is approximately 180 degrees out of phase from the second clock signal;
wherein a first current is conducted from the output of the load when the second clock signal is high;
wherein a first portion of the first current is conducted through the first switching device and through the fifth gain stage when the second clock signal is high;
wherein a second portion of the first current is conducted through the fifth switching device and through the second gain stage when the second clock signal is high;

wherein a second current is conducted through the eighth switching device and through the fifth gain stage when the first clock signal is high;

wherein the first current is greater than the second current;

wherein a third current is conducted through the third switching device and through the first gain stage when the second clock signal is high;

wherein a fourth current is conducted through the seventh switching device and through the third gain stage when the second clock signal is high;

wherein clock feed-through is reduced.

16. A single-ended polar transmitting circuit of claim 15 wherein the DAC further comprises an input and a differential output;

wherein the differential-to-single-ended converter further comprises a differential input and a single output;

wherein the first gain stage has a first input, a second input and an output;

wherein the second gain stage has a first input, a first I/O, and a second I/O;

wherein the third gain stage has a first input, a first I/O, and a second I/O;

wherein the fourth gain stage has a first input, a first I/O, and a second I/O;

wherein the fifth gain stage has a first input, a first I/O, and a second I/O;

wherein the first filter has an input and an output;

wherein the second filter has an input and an output;

wherein the first switching device has an first input, a first I/O and a second I/O;

wherein the second switching device has a first input, a first I/O and a second I/O;

wherein the third switching device has a first input, a first I/O and a second I/O;

wherein the fourth switching device has a first input, a first I/O and a second I/O;

wherein the fifth switching device has an first input, a first I/O and a second I/O;

wherein the sixth switching device has a first input, a first I/O and a second I/O;

wherein the seventh switching device has a first input, a first I/O and a second I/O;

wherein the eighth switching device has a first input, a first I/O and a second I/O;

wherein the current mirror has an input, a first I/O and a second I/O;

wherein the transfer loop has a first I/O and a second I/O;

wherein the load has an input and an output;

wherein the differential output of the DAC is connected to the differential input of the differential-to-single-ended converter;

wherein the output of the differential-to-single-ended converter is connected to the input of the first filter, the first input of the fourth gain stage and the first I/O of the eighth switching device;

wherein the output of the fourth gain stage is connected to the input of the fifth gain stage, input of the second gain stage, the input of the current mirror and the input of the second filter;

wherein the output of the load is connected to the first I/O of the first switching device, the first I/O of the second switching device, the first I/O of the fifth switching device and the first I/O of the sixth switching device;

wherein the first I/O of the fifth gain stage is connected to the second I/O of the eight switching device and to the second I/O of the first switching device;

wherein the first I/O of the translinear loop is connected to the second input of the fourth gain stage;

wherein the second I/O of the translinear loop is connected to the first I/O of the current mirror;

wherein the first clock signal is connected to the input of the eighth switching device, the input of the second switching device, the input of the fourth switching device and the input of the sixth switching device;

wherein the second clock signal is connected to the input of the first device, the input of the third switching device, the input of the fifth switching device and the input of the seventh switching device;

wherein the second I/O of the second switching device and the second I/O of the third switching device are connected to the first I/O of the first gain stage;

wherein the input of the first gain and third gain stages are connected to a first voltage reference;

wherein the second I/O of the fourth switching device and the second I/O of the fifth switching device are connected to the first I/O of the second gain stage;

wherein the second I/O of the sixth switching device and the second I/O of the seventh switching device are connected to the first I/O of the third gain stage;

wherein a ground is connected to the output of the first filter, the output of the second filter, the second I/O of the fifth gain stage, the second I/O of the first gain stage, the second I/O of the second gain stage, the second I/O of the third gain stage and the second I/O of the current mirror;

wherein the input of the load, the first I/O of the third switching device, the first I/O of the fourth switching device, and the first I/O of the seventh switching device are connected to a second voltage reference.

17. The single-ended polar transmitting circuit of claim 16 wherein the resistor R1 has a first and a second connection;

wherein the capacitor C1 has a first and a second connection;

wherein the first connection on the resistor R1 is connected to the input of the first filter;

wherein the second connection on the resistor R1 is connected to the output of the first filter;

wherein the first connection on the capacitor C1 is connected to the input of the first filter;

wherein the second connection on the capacitor C1 is connected to the output of the first filter.

* * * * *